United States Patent [19]
Matsuda

[11] Patent Number: 5,485,022
[45] Date of Patent: Jan. 16, 1996

[54] HIGH SWITCHING SPEED IGBT

[75] Inventor: Tadashi Matsuda, Himeji, Japan

[73] Assignee: Kabushiki Kaisha Toshiba, Kawasaki, Japan

[21] Appl. No.: 273,758

[22] Filed: Jul. 12, 1994

[30] Foreign Application Priority Data

Jul. 12, 1993 [JP] Japan ..................... 5-193877

[51] Int. Cl.⁶ .......................... H01L 29/74; H01L 31/111
[52] U.S. Cl. ................... 257/133; 257/139; 257/147; 257/155; 257/341
[58] Field of Search ..................... 257/132, 133, 257/138, 139, 140, 146, 147, 155, 341, 378, 163, 164, 165, 328, 329

[56] References Cited

U.S. PATENT DOCUMENTS 4,694,313  9/1987  Beason .

FOREIGN PATENT DOCUMENTS

| 0310112 | 4/1989 | European Pat. Off. . | |
|---------|--------|----------------------|---|
| 0315145 | 5/1989 | European Pat. Off. . | |
| 0368246 | 5/1990 | European Pat. Off. . | |
| 0389942 | 10/1990 | European Pat. Off. . | |
| 0599221 | 6/1994 | European Pat. Off. . | |
| 4014207 | 12/1990 | Germany . | |
| 5193877 | 7/1993 | Japan | 257/138 |

OTHER PUBLICATIONS

Patent Abstracts of Japan, vol. 11, No. 11 (E–470) (2458), Jan. 13, 1987, & JP 61–185 971, Aug. 19, 1986, Hideshima.
Patent Abstracts of Japan, vol. 16, No. 166 (E–1193), Apr. 22, 1992, JP 4–014 263, Jan. 20, 1992, Yasukazu.
Patent Abstracts of Japan, vol. 14, No. 244 (E–932) (4187), May 24, 1990, & JP 2–67766, Mar. 7, 1990, Minato.
Patent Abstract of Japan, vol. 13, No. 371 (E–807) (3719), Aug. 17, 1989, JP 1–125 864, May, 18, 1989, Kawamura.

*Primary Examiner*—William Mintel
*Assistant Examiner*—Minhloan Tran
*Attorney, Agent, or Firm*—Oblon, Spivak, McClelland, Maier, & Neustadt

[57] ABSTRACT

An Insulated Gate Bipolar Transistor (IGBT) having a new structure capable of performing a low on-voltage and a high-speed turn-off is provided. A P-type collector region 1 of IGBT is not formed on the entire reverse surface of an N-type base region 2, but formed only on its part, and a metal collector electrode 9 is electrically connected only with the surface to which the P-type collector region 1 exposes. An area of a diffusion window in a collector region is relatively reduced, whereby the impurity concentration of the entire collector region is set at a lower value and hole injection efficiency is decreased. At the same time it is possible to obtain high surface concentration with deep diffusion depth of the collector region required to form a favorable ohmic contact.

6 Claims, 7 Drawing Sheets

HIGH SWITCHING SPEED IGBT

BACKGROUND OF THE INVENTION

1. Field of the Invention

The present invention relates to a semiconductor power device, and particularly to an Insulated Gate Bipolar Transistor (hereinafter, referred to as an IGBT) being a MOS Bipolar composite functional device capable of performing high-speed operations in a medium electric power area of breakdown voltage 1200 V or more.

2. Description of the Prior Art

Lately, MOS composite devices such as an IGBT, a MOS Controlled Thyristor (MCT), an Emitter Switched Thyristor (EST), or the like have been developed. Since these are voltage-driving power devices and easy to use, requirements for developing these new MOS composite devices have fairly been made from a system operation side and its development has abruptly been advanced in response thereto.

Figure 13:
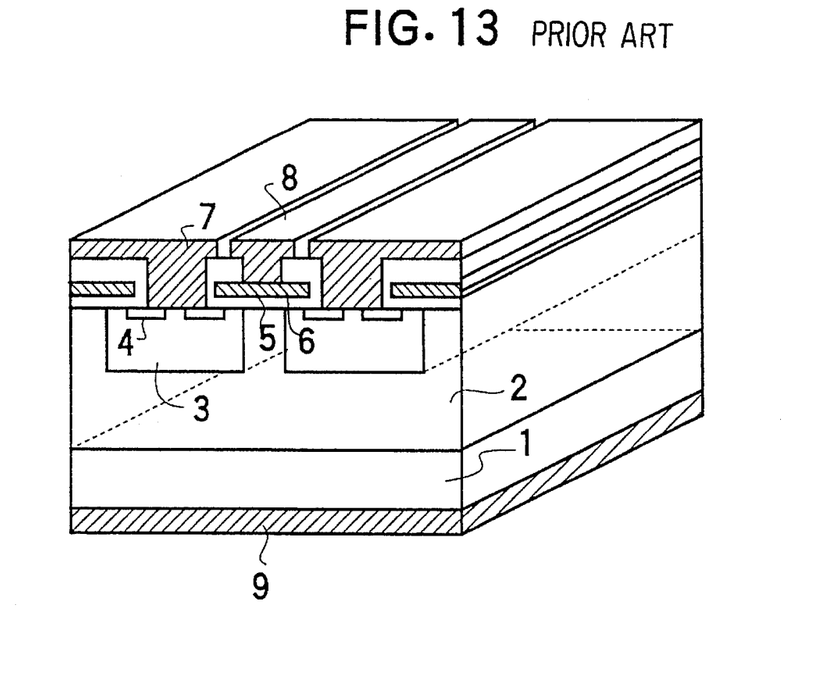
FIGS. 13 to 16 are respectively perspective views of a conventional IGBT.
Figure 14:
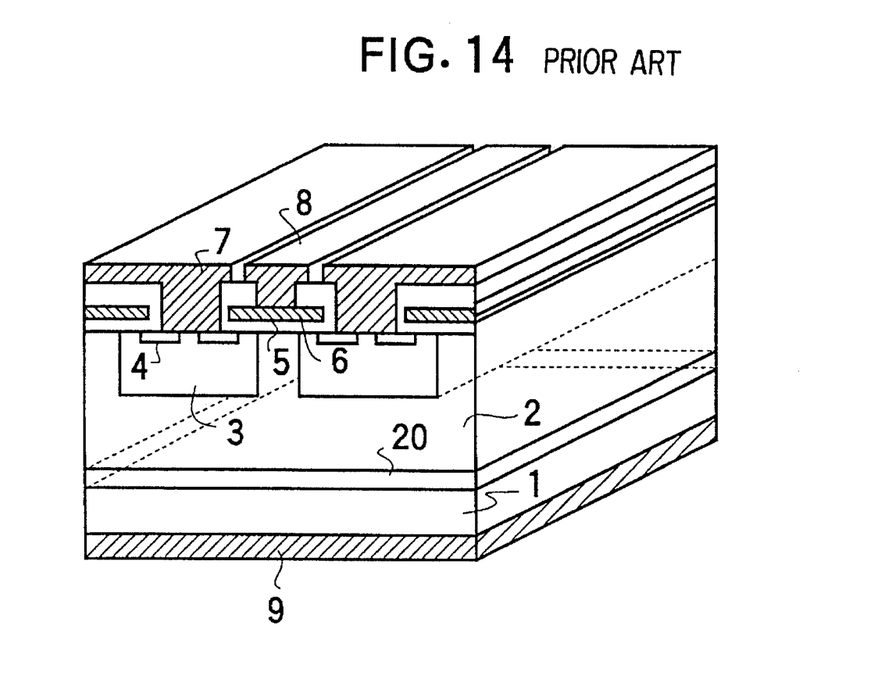

The IGBT is a transistor having a unit cell cross-sectional structure as represented in FIG. 13, and has a composite structure provided with a MOSFET structure in its upper part and a bipolar transistor structure in its lower part. This structure and basic operations are disclosed in the Japanese Patent Application Laid Open No. 57-120369 Official Gazette. On the basis of this description, a conventional N-channel IGBT will be explained. In FIG. 13, a high-resistivity $N^-$ base region 2 having low impurity concentration is formed in a P-type collector region 1. On the surface of the $N^-$ base region 2, a P-type base region 3 is formed by a Double Diffusion Self Alignment method so as to expose its surface. Furthermore, an $N^+$ emitter region 4 is formed in the P-type base region 3 so as to expose its surface. On the surface of the P-type base region 3, a polysilicon gate electrode 6 is provided on a thin insulation film 5 such as $SiO_2$ etc. This gate electrode 6 overlaps the P-type base region 3 and is disposed so as to cover from the $N^-$ base region 2 to the $N^+$ emitter region 4. A metal emitter electrode 7 is provided so that the $N^+$ emitter region 4 may be short-circuited with the P-type base region 3, and a metal gate 8 connecting to the polysilicon gate electrode 6 and a metal collector electrode 9 connecting to the P-type collector region 1 are provided, respectively. Also, in a structure as depicted in FIG. 14, an $N^+$ buffer region 20 is provided between the P-type collector region 1 and $N^-$ base region 2 and such IGBT has generally been known. A general method of manufacturing these conventional N-channel IGBTs will be described below. First, the P-type silicon semiconductor substrate 1 having a thickness of about 150 μm and impurity concentration of about $10^{18}$ to $10^{20}$ cm$^{-3}$ is used as a P-type collector region. A semiconductor layer 2 is formed in vapor-phase epitaxy on this semiconductor substrate 1 to act as the $N^-$ base region. In the embodiment of FIG. 14, after a semiconductor layer 20 being an $N^+$ buffer region has formed in vapor-phase epitaxy, the semiconductor layer 2 will be formed. Thus, a $P-N^-$ (or $P-N-N^-$) wafer is formed. Next, the insulation film 5 such as $SiO_2$ etc. is formed on the surface of the $N^-$ base region 2, and further the polysilicon gate electrode 6 is formed thereon. Next, the polysilicon gate electrode 6 and insulation film 5 are partially opened, and with the use of the polysilicon electrode 6 as a mask, the P-type base region 3 is formed, and further two $N^+$ emitter regions 4 are formed within the P-type base region 3. Next, the insulation film 5 is formed again on the polysilicon gate electrode 6 and P-type base region 3, and further the insulation film 5 formed on the P-type base region 3 containing the polysilicon gate electrode 6 and $N^+$ emitter region 4 is partially removed. Thereafter the window parts in the insulation film on the P-type base region 3, $N^+$ emitter region 4 and the polysilicon gate electrode 6 are deposited with a metal such as aluminum etc. to form the metal gate electrode 8 and metal emitter electrode 7. Thereafter, the metal collector electrode 9 is formed in the P-type collector region 1 to obtain the conventional IGBT as shown in FIGS. 13, 14.

Next, an operation of the IGBT will be explained. The metal emitter electrode 7 is connected to the ground and a positive voltage for the metal emitter electrode 7 is applied to the metal gate electrode 8 in a condition that a positive voltage is applied to the metal collector electrode 9, whereby a turn-on of the IGBT can be realized. When a positive voltage is applied to the metal gate electrode 8, an inversion channel is formed on the surface of the P-type base region 8 in the same manner as the MOSFET and electrons flow into the inside of the $N^-$ base region 2 through the inversion channel from the $N^+$ emitter region 4. As a result, holes occur to inject into $N^-$ base region 2 from the P-type collector region 1, and a PN junction between the P-type collector region 1 and the $N^-$ base region 2 or N-type buffer region 20 (in the embodiment of FIG. 14) becomes in a forward bias state, and the $N^-$ base region 2 causes a conductivity modulation so that the IGBT is guided into a conductive state. As described above, since the resistance in the high-resistivity $N^-$ base region 2 become extremely small due to the conductivity modulation, even if the element has lower concentration of the $N^-$ base region 2 and is thick with high breakdown voltage, a characteristic of extremely small on-resistance can be obtained by the IGBT. On the other hand, a negative voltage for the metal emitter electrode 7 is applied to the metal gate electrode 8, whereby a turn-off of the IGBT can be realized. When a negative voltage is applied to the metal gate electrode 8, the inversion channel is vanished and electrons stop flowing into the $N^-$ base region 2 from the $N^+$ emitter region 4. However, electrons have existed as before within the $N^-$ base region 2. Most of the holes stored within the $N^-$ base region 2 pass through the P-type base region 3 and flow into the emitter electrode 7, however a part thereof is recombined with electrons existing within the $N^-$ base region 2 and disappears. At the time when all the holes stored within the $N^-$ base region 2 disappear, the IGBT becomes in a blocking state to complete the turn-off.

Figure 12:
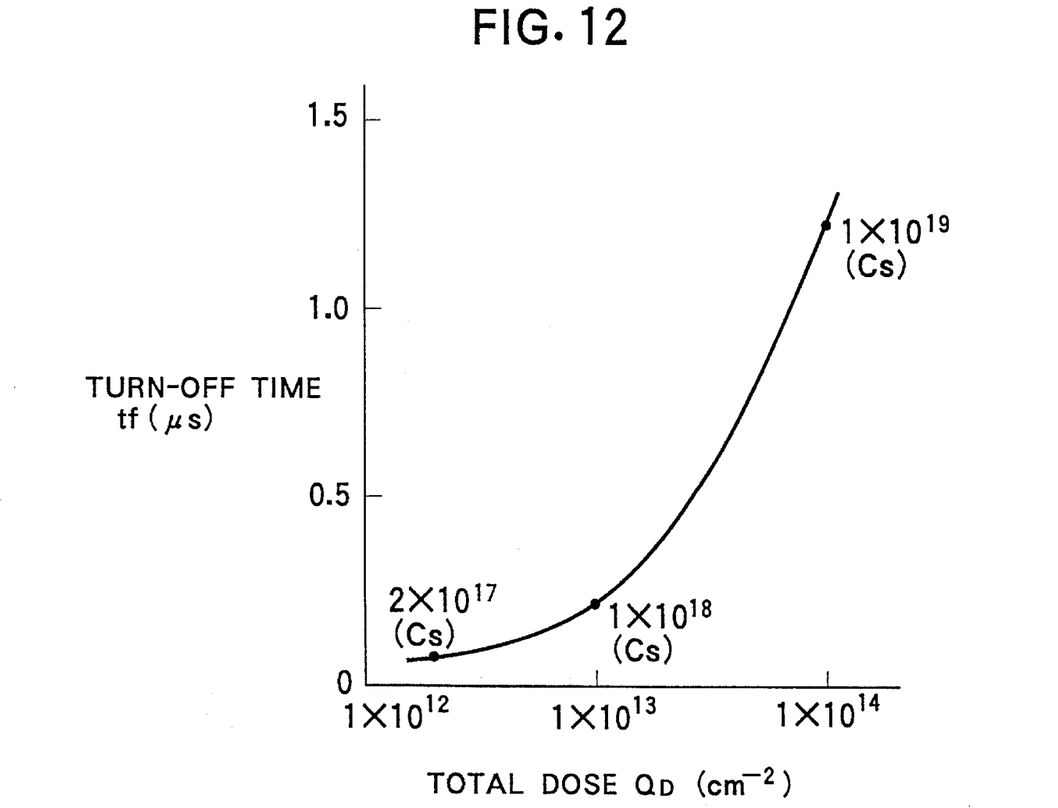
FIG. 12 is a characteristic view showing the relationship between the total impurity dose $Q_D$ (cm$^{-2}$) and a turn-off time $t_f$ (μs)

The high-voltage IGBT is an excellent element which is extremely low on-resistance, however there are some drawbacks that, since it is a minority carrier device, a turn-off time is elongated. A part of a minority carriers (holes) which are injected from a collector region to an $N^-$ base region is stored within the $N^-$ base region as excessive minority carriers. Accordingly, even if a gate voltage is reduced to zero in order to turn off this IGBT and the channel is closed to stop a flow of electrons, an off-state is not available until the stored minority carriers have been discharged. Furthermore, when the electrons existing in the $N^-$ base region 2 pass through the collector region at this turn-off time, new holes are induced to inject from the collector region to consequently elongate the turn-off time. Therefore, in the IGBT, a current can flow about 10 times as much as the normal MOSFET, however the IGBT has drawbacks that its turn-off time comes to elongate 10 times or more as much as the normal MOSFET. In the case where such IGBT is applied to, for instance, switching devices such as an inverter, since the turn-off time is elongated as described above, high switching frequency cannot be obtained, so that its application field is limited. As a method of improving the turn-off time of the IGBT, a method of shortening a carrier life time is generally adopted in the prior art. Specifically, a heavy metal diffusion method such as Au, Pt is taken, or the carrier life time is shortened by radioactive ray such as neutron rays, γ rays or electron beams. Although the turn-off time is improved in this method, the degree of conduction modulation in the N⁻ base region is simultaneously lowered and the low on-resistance characteristic which is the maximum advantage of the IGBT is deteriorated. Also, as another method, there is a method that the injection of holes from the P-type collector region is suppressed reducing the impurity concentration in the P-type collector region. With reference to FIG. 12, total impurity amount dependence in a collector region for a turn-off time of IGBT will be explained. The axis of ordinates denotes a turn-off time (μs) and the axis of abscissas denotes total impurity dose $Q_D$ in the case where it is estimated per 1 cm² of the entire area of a unit cell D in a collector region of IGBT. A curve as shown in this diagram is the characteristics of IGBT in which the collector region with a depth of 0.1 μm is formed on the entire surface of a second main surface of a semiconductor substrate and further a carrier life time shortening is employed to obtain the turn-off time of 10 μs. A numerical value Cs on the curve denotes impurity concentration in the collector region. Also, the total impurity dose in the collector region on the axis of abscissas is a vale when ions of $^{11}B^+$ are implanted at 20 KeV through an oxide film having a film thickness 100 nm. From a viewpoint of FIG. 12, it is understood, as one method of improving the turn-off time, that it is necessary to reduce the impurity concentration in the collector region in order to suppress injection efficiency of holes from the collector region. However, when the impurity concentration in the P-type collector region is reduced, the contact resistance between the semiconductor collector region and metal collector electrode is increased and its amount of scatter are also extended, whereby this poor contact deteriorates the on-resistance characteristics of the IGBT. This is because the junction depth should be shallow, or 0.1 μm, with such a low total impurity dose in collector region 1 of about $10^{12}$ to $10^{14}$ cm⁻², to obtain high surface impurity concentration required to make a good ohmic contact. And if the junction depth is shallowed like this, the metal material of collector electrode penetrates through the collector region to produce a spike or a piping. Then, it is apprehensive that the N⁻ base region is short-circuited and it is difficult to stably manufacture the device.

Figure 15:
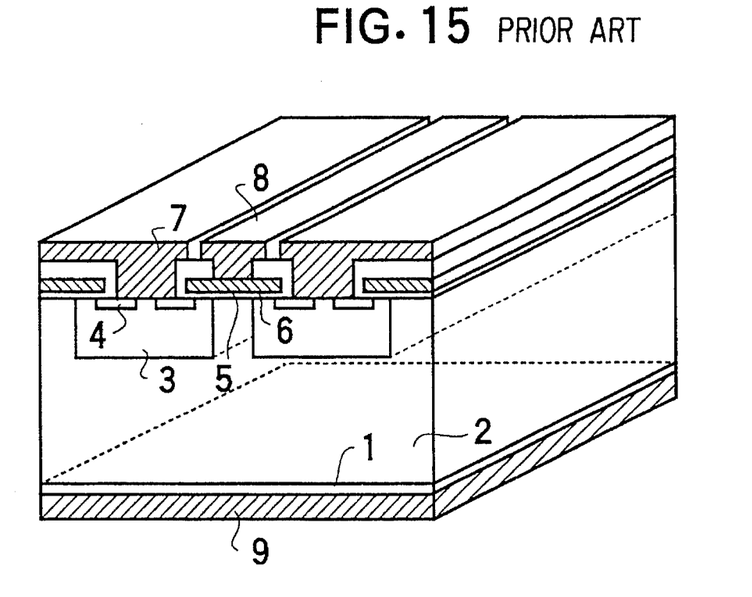

In addition, there is another method of increasing the impurity concentration of the N-type buffer region. However, since the controllability of the present vapor-phase epitaxy method is low, it is impossible to stably manufacture devices. Also, impurities in the N-type buffer region diffuse within the N⁻ base region by thermal hysteresis in an IGBT manufacturing process, and finally the concentration off the N-type buffer region 20 is decreased and its thickness is increased, so that some problems occur that expected effects are not obtained. Furthermore, in the case of a high voltage IGBT having breakdown voltage $BV_{CES}$ 1200 V or more between the collector and emitter, a thick N⁻ base region having very low concentration of $5\times10^{13}$ atm/cm³ or less and a thickness of 100 μm or more is required, and it is difficult to form such thick epitaxial layer or to stably manufacture devices by the present vapor-phase epitaxy. Also, in a structure as shown in FIG. 15, a double diffusion type DMOS structure is formed on one main surface of an N⁻ semiconductor substrate having low concentration and the P-type collector region 1 is formed on the other main surface by implanting ions, and such structure has been disclosed in the Japanese Patent Application Laid Open No. 2-7569 Official Gazette. However, since, in such structure, the total impurity dose in the P-type collector region 1 per unit area is low, or about $10^{12}$ to $10^{14}$ cm⁻², the junction must be shallowed, or 0.1 μm to make an ohmic contact with the metal collector electrode 9, and then it is apprehensive that the metal collector electrode penetrate through the P⁺ collector region 1 and that the P⁺ collector region 1 is short-circuited with the N⁻ base region 2, therefore there occur some problems that it is impossible to manufacture stably devices. Also, in the case where the junction is deep, or set at about 3 μm, the surface concentration of the P⁺ collector region 1 becomes very low, or about $5\times10^{15}$ to $1\times10^{16}$ atm/cm³, therefore it becomes difficult to make an ohmic contact with the metal collector electrode 9, and as a result, there are drawbacks that the on-voltage of the IGBT becomes high.

Figure 16:
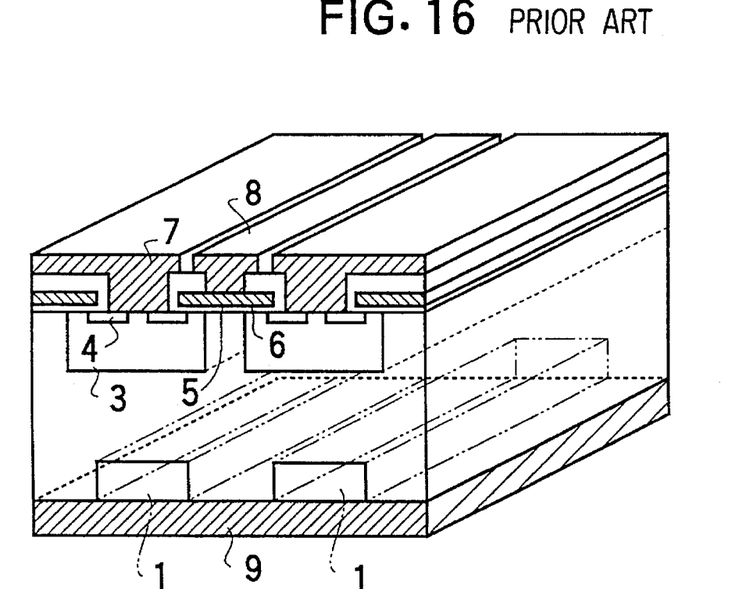

And there is another IGBT called "the corrector-short IGBT" as shown in FIG. 16, the P-type collector region 1 is partially provided and the metal collector electrode 9 is formed so that the P-type collector region 1 may be short-circuited with the N⁻ base region 2. In the embodiment of this structure, as a main current flows into a shunt resistor formed in a short part, there occur some problems that the on-resistance becomes high by the voltage drop caused by this.

SUMMARY OF THE INVENTION

Accordingly, it is an object of the present invention to provide a new semiconductor device (IGBT) having a lower on-voltage and further a short turn-off time.

It is another object of the present invention to provide a high-speed IGBT having a new structure which can readily and stably be manufactured, and which has a high manufacturing yield and a low on-voltage.

It is still another object of the present invention to provide an IGBT which can readily be activated at a high breakdown voltage and a greater current, and in which the trade-off relation (correlation diagram) between the on-voltage ($V_{CE}$ (sat)) and turn-off time ($t_f$) is improved.

Specifically, it is an object of the present invention to provide an IGBT having high breakdown voltage, high frequency, low on-resistance, and a low loss in a new structure that it is easy to make an ohmic contact with a metal collector electrode, and that the injection of excessive minority carriers from a collector region can be suppressed.

In order to achieve the above-described objects, a semiconductor device of the present invention is an IGBT characterized in that a collector region is partially formed on the specific main surface of a semiconductor substrate, and in that a collector electrode is electrically connected with only the collector region in the semiconductor substrate. That is, the semiconductor device of the present invention is characterized by providing a semiconductor substrate, a first conductivity type (for example, N-type) base region formed on the semiconductor substrate and exposing onto a first main surface of the semiconductor substrate, a second conductivity type (P-type) base region formed within the N-type base region and exposing onto the first main surface of the semiconductor substrate, an N-type emitter region formed within the P-type base region and exposing onto the first main surface of the semiconductor substrate. A gate insulation film stepping over the emitter region and the N-type base region on the first main surface and formed on the P-type base region. And a gate electrode formed on the gate insulation film, an emitter electrode formed so as to step over the emitter region and the P-type base region on the first main surface and short-circuiting between this emitter region and the P-type base region. A P-type collector region formed partially on the second main surface of the semiconductor substrate, and a collector electrode connecting electrically in the window part of the collector region in the semiconductor substrate. An insulation film is formed on the second main surface excluding the window part of the collector region, and the collector electrode extends on this insulation film. The collector region may be disposed right under the gate electrode, or right under the emitter region or right under the gate electrode and the emitter region. A junction depth of the P-type collector region is decided by heat treatment conditions, and when the total impurity dose and junction depth in the collector region are made constant, its surface concentration is decided by an area of the P-type collector region for the entire area on the reverse surface of the IGBT forming the collector electrode, and the smaller its area becomes, the higher the surface concentration can be set. Accordingly, even when the total impurity concentration in the collector region is reduced and injection efficiency of holes from the collector is reduced, as such a structure can be obtained that the junction depth in the P-type collector region is deeper, and that the surface concentration can be increased, there are no possibilities that the collector electrode penetrate through the collector region, so that the collector electrode is short-circuited with the N⁻ base region, and also a junction between the collector region and collector electrode is stabilized. Simultaneously, as the injection of excessive holes from the collector region is suppressed, and as a result, the electron concentration stored on the collector front surface is suppressed, a turn-off time can be shortened to perform high-speed operations.

Other and further objects and features of this invention will become obvious upon an understanding of the illustrative embodiments to be described in connection with the accompanying drawings or will be indicated in the appended claims, and various advantages not referred to herein will occur to one skilled in the art upon employing of the invention in practice.

DETAILED DESCRIPTION OF THE EMBODIMENTS

Various embodiments of the invention will be described with reference to the accompanying drawings. It should be noted that the same or similar reference numerals are applied to the same or similar parts and elements throughout the drawings, and the description of the same or similar parts and elements will be omitted or simplified.

Figure 1:
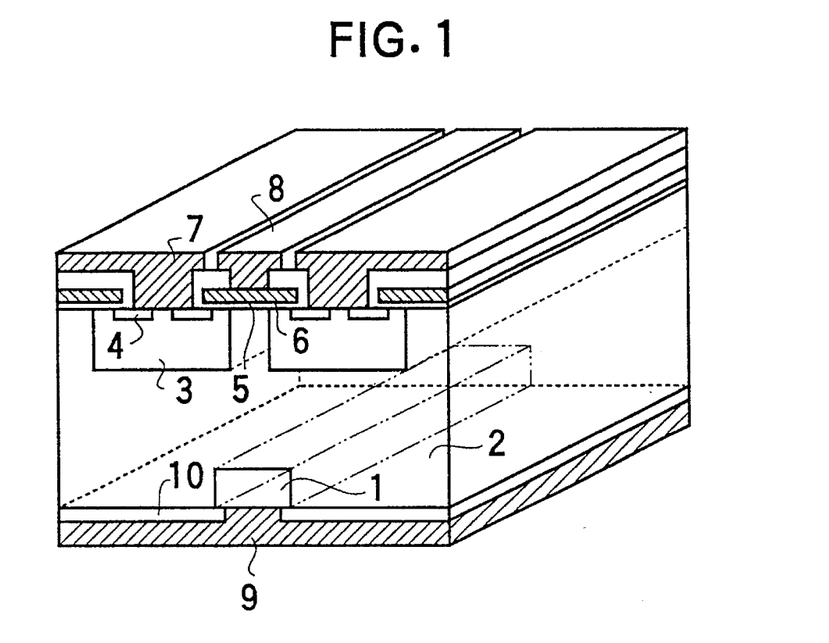
FIG. 1 is a perspective view of a semiconductor device in a first embodiment of the present invention.
Figure 2:
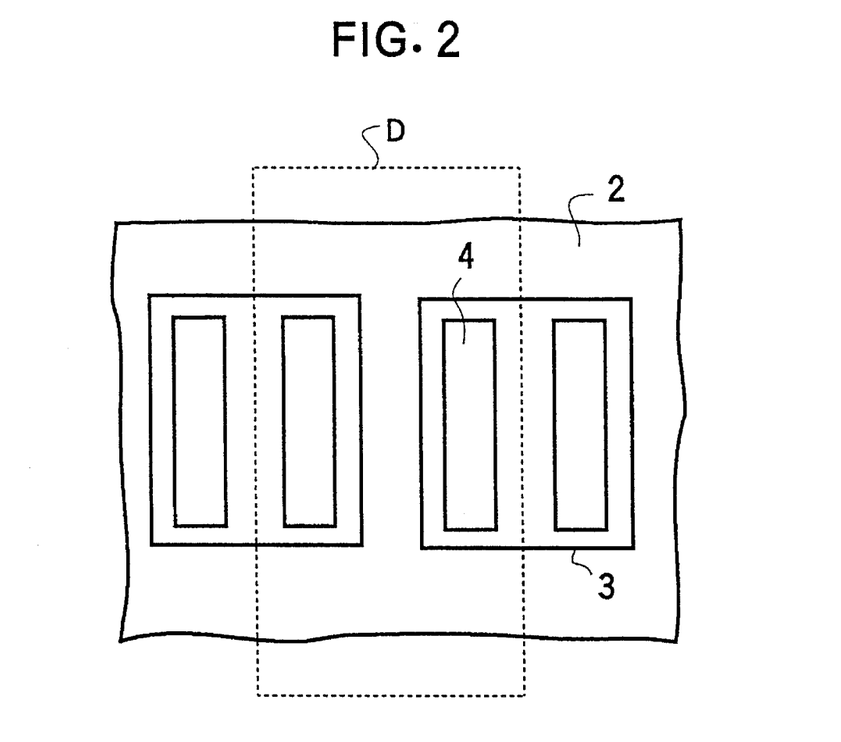
FIG. 2 is a typical plane view showing a first main surface of the semiconductor device of FIG. 1.
Figure 3:
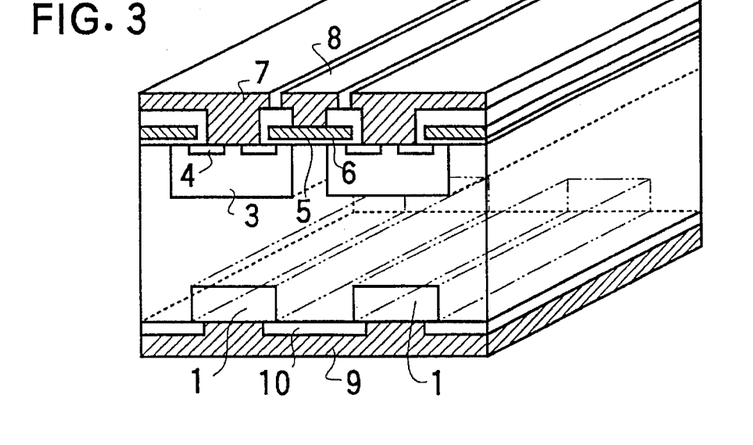
FIGS. 3 to 7 are respectively perspective views of semiconductor devices in second, third, fourth, fifth, and sixth embodiments of the present invention.

First, a first embodiment of the present invention will be explained with reference to FIGS. 1, 2. FIG. 1 is a perspective view of a semiconductor device of the present invention, and FIG. 2 is a plane view showing a first main surface of a semiconductor substrate 2 omitting an insulation film 5, a polysilicon gate 6, or the like of FIG. 1. D of FIG. 2 denotes a unit cell, and actually a plurality of unit cells are disposed in accordance with a desired current. This embodiment is explained using an N-channel transistor, however the present invention can be applied to a P-channel transistor irrespective of a channel type. As shown in the figures, for instance, a high resistivity N-type silicon semiconductor substrate having (100) surface acting as N⁻ base region 2 is prepared, and a P-type collector region 1 is formed on its second main surface. A P-type base region 3 is formed so that its surface may be exposed onto the surface of the N⁻ base region 2, that is onto the first main surface of the silicon semiconductor substrate. Furthermore, an N⁺ emitter region 4 is formed so that its surface may be exposed onto the P-type base region 3. And, a polysilicon gate 6 is provided on a thin gate insulation film 5 such as SiO$_2$ etc. on the surface of the P-type base region 3. A refractory metal such as W, Ti, Mo, or their silicides, or their polycides may be used instead of polysilicon. This polysilicon gate 6 steps over the P-type base region 3 and is disposed so as to cover from the N⁻ base region 2 to the N⁺ emitter region 4. A metal emitter electrode 7 such as Al, Al-Si, Al-Cu-Si is provided so that the N⁺ emitter region 4 can be short-circuited with the P-type base region 3 on the surface, and a metal gate electrode 8 such as Al etc. connecting to the polysilicon gate 6 and a metal collector electrode 9 such as Al, Al-Si, Al-Cu-Si, Au, W, Mo connecting to the P-type collector region 1 are provided, respectively. The first embodiment of the present invention is characterized in not that the P-type collector region 1 is formed on the entire surface of a second main surface of the semiconductor substrate 2, in but that the P-type collector region 1 is partially formed. In this embodiment, the P-type collector region 1 is disposed right under and along the gate 6. And, a collector electrode 9 is electrically connected with the P-type collector region 1 in the contact window on the surface of the semiconductor substrate 2. Accordingly, as the collector electrode 9 is formed on the entire surface of the second main surface, in order to prevent a contact with other regions, regions other than the contact window of P-type collector region 1 are coated with an insulation film 10. The collector electrode 9 coats the insulation film 10 and the P-type collector region 1, and this insulation film 10 may extend so as to partially coat the P-type collector region 1. Taking into consideration of breakdown voltage of the insulation film 10, its thickness is about 0.1 to 2 μm, and SiO$_2$ is used as its material in this embodiment. However, a material in the present invention is not limited to this one and Si$_3$N$_4$, Al$_2$O$_3$, SiO$_2$/Si$_3$N$_4$, SiO$_x$N$_y$, SiO$_3$N$_4$/SiO$_2$, SiO$_2$/Si$_3$N$_4$/SiO$_2$, Si$_3$N$_4$/SiO$_2$/Si$_3$N$_4$, or oxygen-doped polycrystalline-silicon film (SIPOS) can also be used.

Next, a method of manufacturing a semiconductor in this embodiment will be explained. First, an N-type silicon semiconductor substrate 2 (N⁻ base region) having resistivity 20 Ωcm or more and a thickness about 250 μm is prepared, and the entire surface of this N⁻ base region 2 is thermally oxidized to form a field oxide film of 0.8 to 1.5μ. Thereafter the field oxide film in a part in which a device region will be formed is removed thermally oxidize again the exposed Si surface to form the gate insulation film 5 of about 100 nm. The polysilicon gate 6 of 500 nm is deposited thereon by a Chemical Vapor Deposition (CVD) method etc. Thereafter, the polysilicon gate 6 is cut and formed using photolithography technology and RIE etc. and with the use of the polysilicon gate 6 and the field oxide film as a mask, boron is diffused in depth about 8 μm to form the P-type base region 8. Next, an oxide film is formed by the CVD method etc. on the surface of the P-type base region 8 and thereafter an oxide film mask (not shown) having an window for forming the emitter region 4 is formed by the photolithography, and with the use of this oxide film mask and the polysilicon Kate 6 as a mask $^{75}As^+$ ions of the dose $5 \times 10^{15}$ cm$^{-2}$ are implanted, and after heat treatment, the N$^+$ emitter region 4 is formed within the P-type base region 3. Next, insulation films 5, 10 of about 0.8–1.5 μm are formed on the entire surface of the first and second main surfaces of the semiconductor substrate 2 by the CVD method. Thereafter, after the insulation film 10 on the back surface (second main surface) of the N⁻ base region 2 is partially removed ions of boron ($^{11}B^+$, $^{49}BF_2^+$) of the dose $1 \times 10^{12}$ cm$^{-2}$ to $1 \times 10^{14}$ cm$^{-2}$ are implanted from the window part. Thereafter, after heat treatment, the P-type collector region 1 is formed in depth about 3 to 10 μm from the back surface. When the collector region 1 is formed in depth about 10 μm, before a process of forming the gate oxide film 5 on the first main plane surface, the process of forming the collector region is beforehand carried out. Next, the insulation films 5, 10 on the first and second main surfaces are selectively removed, and after a metal such as Al, Al-Si has been formed on the entire surface of the first main surface, it is patterned to form the metal emitter electrode 7 and metal Kate electrode 8. A metal such as Al, Au, Au-Sb, Mo, W is deposited on the second main surface to form the metal collector electrode 9, so that the semiconductor device as shown in FIG. 1 can be completed.

In the semiconductor device in the first embodiment of the present invention, the P-type collector region 1 formed on the second main surface (back surface) is partially formed, and the metal collector electrode 9 comes into contact with only the P-type collector region 1 in the window part of the back surface, whereby, even if the total impurity dose taking into consideration of the entire area of the substrate surface is set low at about $10^{12}$ to $10^{14}$ cm$^{-2}$, substantial impurity density in the P-type collector region 1 can be made high. Therefore, as the junction depth of the P-type collector region 1 can be deeper and surface concentration can be higher, the metal collector electrode 9 could not penetrate through the P-type collector region 1 (so-called piping) unlike the conventional structure shown in FIG. 15. And there are not any possibilities at all that the P-type collector region 1 is short-circuited with the N⁻ base region 2. Also, as an alloy temperature for forming an ohmic contact of the collector electrode can be sufficiently made high, the P-type collector region 1 is connected stably with the metal collector electrode 9, the attempts to reduce ohmic resistance, improve an on-voltage, and manufacture stably devices are easily made. By the way, in the semiconductor device of the present invention, the junction depth of the P-type collector region 1 can be set at a desired depth according to heat treatment conditions, however when the total impurity amount and junction depth are made constant, the surface density comes to depend on a ratio of the surface area of the P-type collector region or a contact window area to the entire cell area, and the more its area is reduced, the higher the surface concentration can be made. However, when the area is extremely made small, as the contact window area with the metal collector electrode 9 becomes small, the contact resistance is increased and the increased resistance exerts bad influences on the on-voltage. As a result, it is not favorable that the area of the collector region is reduced so that its area may become 1/25 times or less to the area of the unit cell D shown in FIG. 2. In particular, in order to reduce the contact resistance, right before formation of the metal collector electrode 9, the high impurity concentration P$^{++}$-type layer is rediffused only on the surface of the collector region in depth 50 to 100 nm. And the metal collector electrode 9 may be formed on the rediffused P$^{++}$-type layer by vacuum-evaporation, sputtering, a CVD method, or the like. More specifically, $^{49}BF_2^+$ of the dose $5 \times 10^{15}$ cm$^{-2}$ is implanted at 60 keV and annealed at 800° C. for about 30 min., or a thin film of boron is directly formed by the CVD method such as Molecular Layer Doping (MLD) etc., namely these methods are effective. Furthermore, to form a refractory metal such as Pt, Ti, Zr, Hf, V, Ti/TiN, or a contact metal/barrier metal layer composed of these silicides on the interface between the metal collector electrode and P$^{++}$-type layer/P-type collector region is effective in reducing the contact resistance. For instance, if Hf is used as the contact metal/barrier metal layer and heat-treated at 580° C., the contact resistance of about $2 \times 10^{-7}$ Ωcm$^2$ can readily be realized and as the P-type collector region is deep, or in three to 10 μm, there occur no problems that, in this embodiment, the metal collector electrode penetrate through the P-type collector region 1.

In addition, in the semiconductor device of the present invention, as the total impurity amount in the P-type collector region 1 can be set at an extremely low value, or at less than $10^{12}$ cm$^{-2}$, a carrier life time in the N⁻ base region 2 keeps long, while the hole injection from the P-type collector region 1 is suppressed to be extremely low, whereby a very high-speed turn-off characteristic can be obtained. Also, since the carrier life time in the N⁻ base region 2 is prolonged and density in a recombination center is low, the holes injected from the P-type collector region 1 are contributed to conductivity modulation with excellent efficiency and the on-voltage becomes low and the trade-off relationship between the on-voltage ($V_{CE}$ (sat)) and turn-off time ($t_f$) can considerably be improved and a trade-off curve is shifted to the low on-voltage and high-speed turn-off side.

In this embodiment, a carrier life time killer can be formed only in the N⁻ base region 2 in an intermediate part in the P-type collector regions 1 corresponding respectively to the adjoining unit cells D. If the life time killer is selectively formed like this, a turn-off time can be shortened without reducing the degree of the conductivity modulation in the region in which a main current flows. Of course, in a so-called collector short structure in which an n$^+$ region is formed on the second main surface in the N⁻ base region 2 in an intermediate part of the adjoining P-type collector regions 1, the more high-speed turn-off is available by extracting electrons. In this embodiment, if an interval of the adjoining P-type collector regions 1, that is a pitch of the unit cell D is picked out so as to be about two times or less as much as a diffusion length $L_n$ of electrons, the electrons are effectively extracted, so that the turn-off with extremely few tail current can be realized.

Next, second to sixth embodiments of the present invention will be shown with reference to FIGS. 3 to 7. These figures are perspective views of a semiconductor device (IGBT) which has the same structure as FIG. 1 excluding a P-type collector region as shown in the figures. In FIG. 1, the P-type collector region 1 is formed parallel to the P-type base region 3, and as the region 1 is formed right under and along the polysilicon gate 6 disposed in a stripe form, its MOS characteristic can be enhanced. In the second embodiment of the present invention in FIG. 3, the P-type collector region 1 is formed parallel to the P-type base region 3 right under and along this P-type base region 3. Accordingly, two collector regions of this type are disposed in a stripe form in one cell region of IGBT. With such structure, a bipolar characteristic is enhanced by forming a PNP structure vertically.

Figure 4:
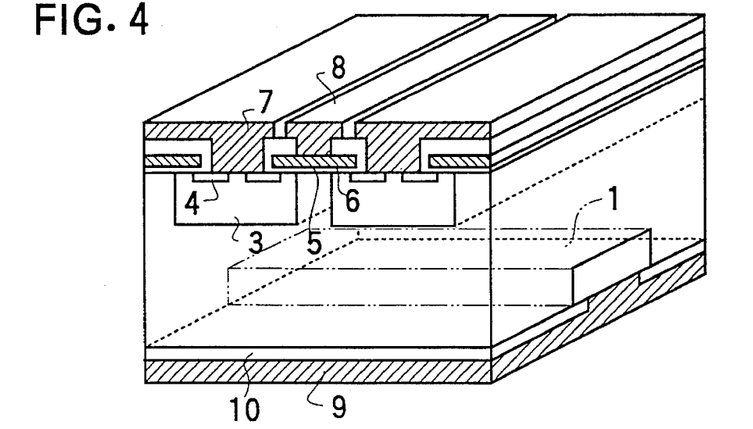

In the third embodiment of the present invention in FIG. 4, the P-type collector region 1 is formed in a stripe form and disposed in the direction of crossing perpendicularly the polysilicon gate 5 and the P-type base region 3. Therefore, the P-type collector region 1 is formed right under the polysilicon gate 6 and P-type base region 3. Accordingly, the MOS characteristic and bipolar characteristic are improved.

Figure 5:
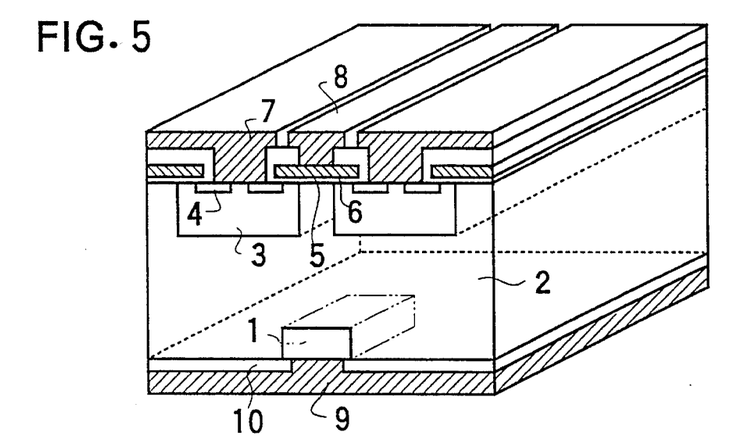

In the fourth embodiment of the present invention in FIG. 5, the P-type collector region of IGBT is disposed in the same manner as FIG. 1 but shorter than the collector region of FIG. 1. When the total impurity amount and junction depth for the entire area of the second main surface are made constant, as the surface concentration in the collector region is decided according to the surface area in the collector region, this surface area can be made small and the surface concentration can be made high. In this embodiment, it is effective that a $P^{++}$ layer is rediffused in a contact part, and that the contact metal/barrier metal such as Hf etc. is also used. However, as described above, taking into consideration of an ohmic characteristic of a collector electrode and producibility of semiconductor devices, a contact area between the collector electrode and collector region is required not to be smaller than about 1/25 times as much as an area of a unit cell.

Figure 6:
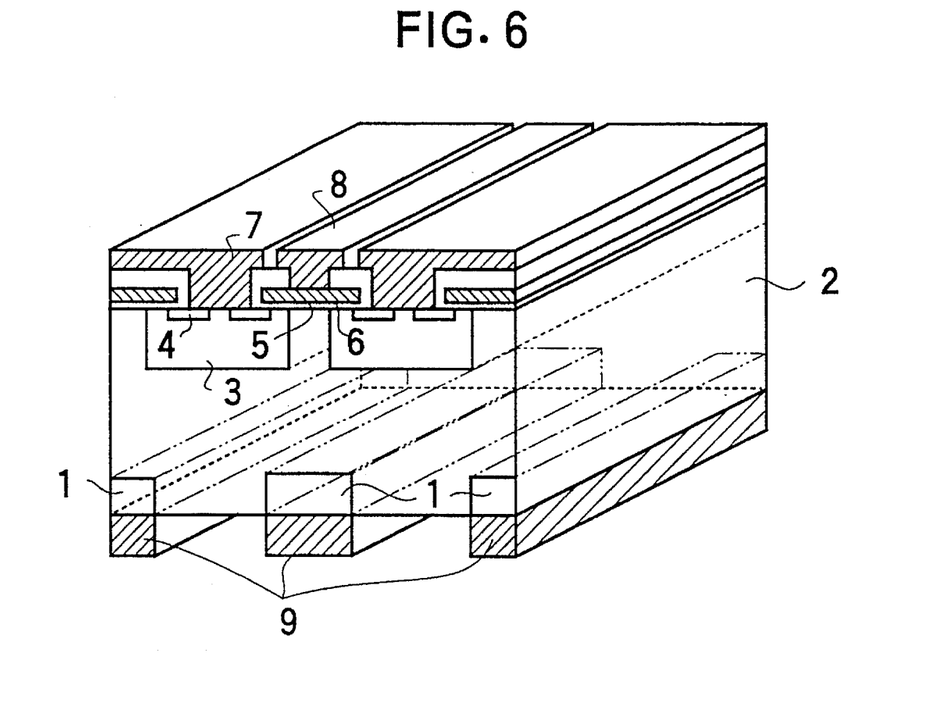

In the fifth embodiment of the present invention in FIG. 6, the P-type collector region 1 is formed parallel to the P-type base region 3 right under and along this P-type base region 3 and the polysilicon gate 6. Accordingly, three collector regions of this type are disposed in a stripe form in one cell region of IGBT. With such structure, the MOS characteristic and bipolar characteristic are improved.

Figure 7:
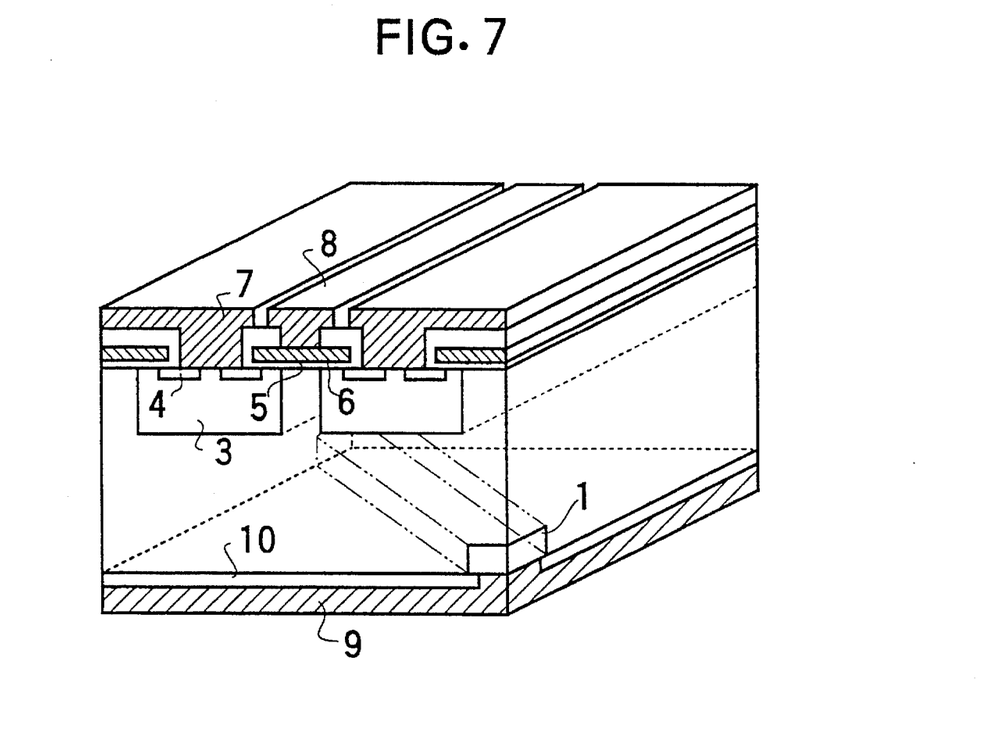

In the sixth embodiment of the present invention in FIG. 7, the P-type collector region 1 is formed in a stripe form in the same manner as FIG. 4 and disposed in the direction of about 45 degrees with respect to the polysilicon gate 5 and P-type base region 3. Therefore, as the P-type collector region 1 is formed right under the polysilicon gate 6 and P-type base region 3, the MOS characteristic and bipolar characteristic are ameliorated. Wen using such a substrate that (111) surface is main plane surface, as an $N^-$ base region, it is also effective that the region is disposed in the direction of 60 degrees from crystal symmetry. In any of these embodiments, the same effects as the IGBT of FIG. 1 can be obtained. As long as the total impurity and area in the P-type collector region 1 and the contact window area with the collector electrode 9 are same, no differences in the device characteristics appear even in any embodiments.

Figure 8:
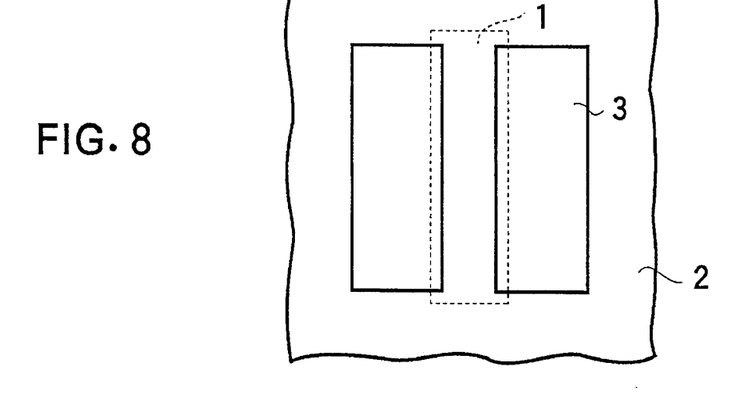
FIG. 8 is a view showing the position relationship between a P-type collector region 1 and a P-type base region 3 in the semiconductor device of FIG. 1.
Figure 9:
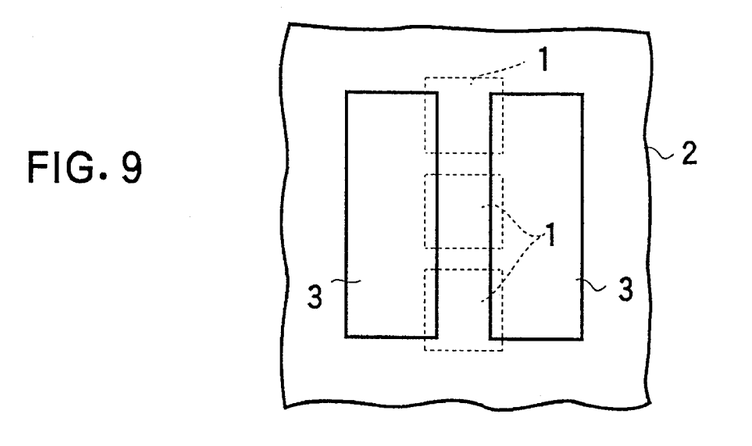
FIGS. 9 to 11 are views showing the position relationship between the P-type collector region 1 and the P-type base region 3 in still another embodiment of the present invention.
Figure 10:
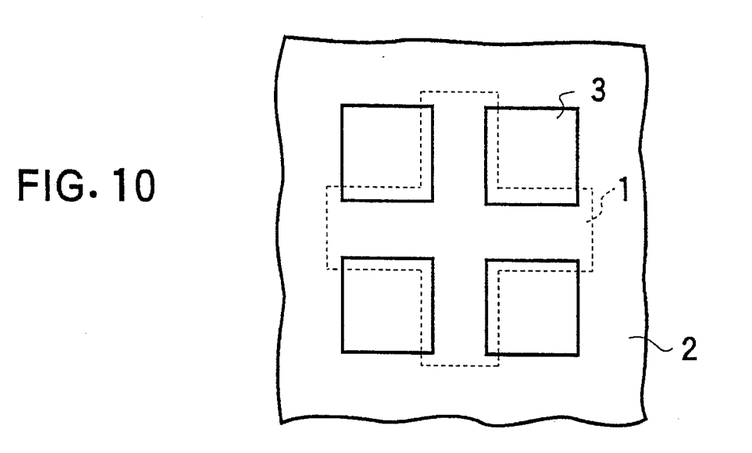
Figure 11:
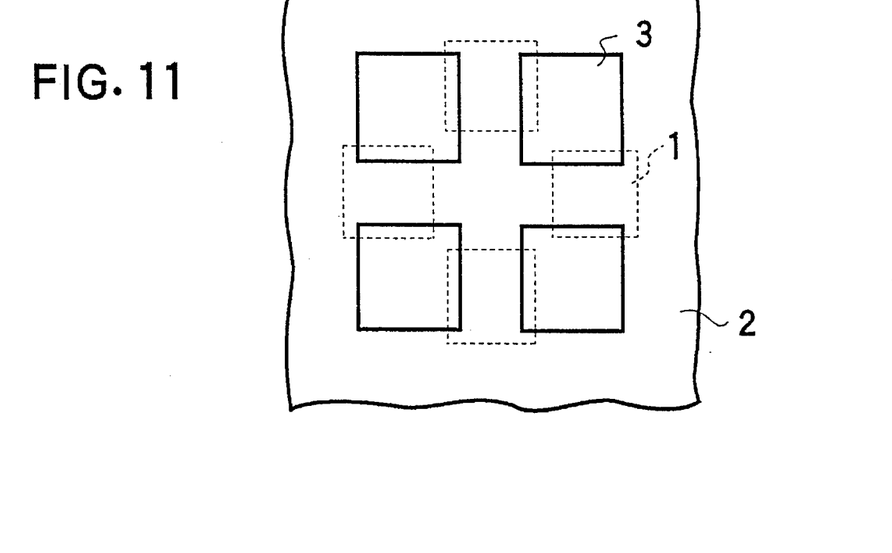

In this connection, FIGS. 1 to 7 depict such an embodiment that an upper MOSFET region in the IGBT has a stripe structure, however the present invention can also, of course, be applicable to such an embodiment that the MOSFET region has a mesh structure. FIG. 8 is a plane view of a first main surface of a semiconductor substrate in order to define the position relationship between the P-type collector region and P-type base region of the IGBT of FIG. 1. A plurality of P-type base regions 3 are substantially spaced and arranged in a stripe form within the semiconductor substrate 2. The P-type collector region 1 is formed right under between the adjoining two P-type collector regions 3 having a stripe form in the same manner. This polysilicon gate off the IGBT (not shown) is formed right under the P-type collector region 1 and formed on the first main surface of the semiconductor substrate 2 so as to step over two P-type base regions 3. FIGS. 9 to 11 show a P-type base/P-type collector structure other than FIGS. 3 to 7. In FIG. 9, the P-type collector region 1 is a regular square and formed at substantially constant intervals right under between the P-type base regions 3 disposed parallel in a stripe form in the same manner as FIG. 8. The polysilicon gate has the different shape from the P-type collector region 1 and is continuously linked together and formed on the first main surface so as to step over the P-type base region 3 right above the P-type collector region 1.

In FIG. 10, the P-type base regions 3 are substantially a regular square and arranged on the first main surface in a matrix form. The P-type collector region 1 is formed right under between the P-type base regions 3. In FIG. 10, four P-type base regions 3 are shown and a cross of P-type collector region 1 is disposed. The polysilicon gate is continuously formed between these P-type base regions 3 and latticed. This collector region is continuously formed in a lattice form with neighboring unit cells. In FIG. 11, four P-type base regions 3 are shown and four P-type collector regions 1 are disposed. In such a manner, the shape of the P-type collector region 1 is not exceptionally limited.

As shown in FIG. 12, the turn-off time $t_f$ depends on the total impurity dose $Q_D$ in the collector region, and when this impurity dose is suppressed to be about $10^{14}$ atm/cm$^2$ or less, the turn-off time $t_f$ can be made about 1.5 µs or less. The embodiment of the present invention maintains this low total impurity dose, while the collector region 1 is locally limited without forming it on the entire surface and the contact window area in the collector region coming into contact with the metal collector electrode is relatively made smaller, whereby substantial impurity concentration in the collector region 1 can be increased. Therefore, the junction depth can be made deeper than usual (about 0.1 µm), and as a result, the metal collector electrode does not penetrate through the collector region and it is possible to stably carry out the junction and to stably manufacture devices. In the case where the collector region is shallow, or in about 0.1 µm, as its metal semiconductor interface is silicified and short-circuited with a base region by the phenomenon such as an Al-spike, an Al-piping, hole injection efficiency etc. are deteriorated. However, as the junction depth in the present invention is deep, or in 3 to 10 µm, such problems never occur, and reversely it becomes possible to increase a heat treatment temperature for forming an ohmic contact electrode.

Furthermore, as the semiconductor substrate of the present invention does not need a semiconductor layer formation by a vapor-phase epitaxy therein, semiconductor devices can stably and readily be fabricated. Nevertheless, the present invention can be applied to semiconductor devices containing a conventional buffer layer as shown in FIG. 14.

In short, the antinomic relation that the requirement to decrease the impurity concentration for lowering the collector injection efficiency and that to increase the impurity concentration for making favorable an ohmic contact must be satisfied at the same time. Therefore, according to the present invention, it is possible to simultaneously reduce two parameters such as a reduction in a turn-off time $t_f$ and a reduction in an on-voltage $V_{CE}$ (sat) which has the trade-off relations each other. Consequently, a trade-off curve of the turn-off time $t_f$ and the on-voltage $V_{CE}$ (sat) is shifted to the side of a high-speed turn-off and a low on-voltage. Moreover, a manufacturing process for executing this is extremely simple and stable and a manufacturing yield becomes high.

As boron of the P-type impurity is smaller in an atomic radius than Si, if it is doped to be $5\times10a^{18}$ cm$^{-3}$ or more, crystal defects or lattice distortions are caused in the conventional devices. However, in the present invention, the P-type collector region is partially formed, even if it is set at high concentration of $1\times10^{19}$ cm$^{-3}$ or more, the crystal defects or lattice distortions are not caused and the conductivity modulation is effectively performed to reduce the on-voltage. Of course, boron doping for collector region may be performed simultaneously with Ge as lattice distortion compensation or the doping of Ge may be performed only in a region between the P-type collector region.

Various modifications will become possible for those skilled in the art after receiving the teachings of the present disclosure without departing from the scope thereof.

What is claimed is:

1. A semiconductor device comprising:
   (a) a first conductivity type base region having first and second main surfaces, the second main surface having a total surface area of A;
   (b) a second conductivity type base region exposing onto said first main surface and formed in said first conductivity type base region;
   (c) a first conductivity type emitter region formed within said second conductivity type base region and exposing onto a first main surface;
   (d) a gate insulation film overlapping said emitter region and said first conductivity type base region on said first main surface and formed on an upper part of said second conductivity type base region;
   (e) a gate electrode formed on said gate insulation film;
   (f) an emitter electrode formed so as to overlap said emitter region and said second conductivity type base region in said first main surface and short-circuiting the emitter region with the second conductivity type base region;
   (g) a second conductivity type collector region formed partially in a specific part on said second main surface of said first conductivity type base region and having a thickness of 3 to 10 μm; and
   (h) a collector electrode connecting electrically only to a contact window part on said second conductivity type collector region,
   wherein the impurity concentration of said collector region is $10^{12}$ to $10^{14}$ cm$^{-2}$,
   wherein the excessive injection of minority carriers from the collector region is suppressed.

2. A semiconductor device as claimed in claim 1, wherein
   an insulation film is formed on said second main surface excluding said specific part on said second main surface or on said second main surface containing partially said specific part on said second main surface, and said collector electrode extends onto the insulation film.

3. A semiconductor device as claimed in claim 1 or 2, wherein
   said second conductivity type collector region is disposed right under said gate electrode.

4. A semiconductor device-as claimed in claim 1 or 2, wherein
   said second conductivity type collector region is disposed right under said first conductivity type emitter region.

5. A semiconductor device as claimed in claim 1 or 2, wherein
   said second conductivity type collector region is disposed right under said gate electrode and said first conductivity type emitter region.

6. A semiconductor device as claimed in claim 1 or 2, wherein
   the surface area of said specific part on said second main surface is 1/25 times or more as much as the entire surface area of said second main surface.

* * * * *